United States Patent
Hashizume et al.

(10) Patent No.: US 6,495,928 B1
(45) Date of Patent: Dec. 17, 2002

(54) TRANSFER MARK STRUCTURE FOR MULTI-LAYER INTERCONNECTING AND METHOD FOR THE MANUFACTURE THEREOF

(75) Inventors: Yasushi Hashizume, Tokyo (JP); Takahisa Eimori, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/467,910

(22) Filed: Dec. 21, 1999

(30) Foreign Application Priority Data

Jul. 6, 1999 (JP) .......................................... 11-191875

(51) Int. Cl.[7] .............................................. H01L 23/48
(52) U.S. Cl. ...................................... 257/797; 257/758
(58) Field of Search .................................. 257/758, 797

(56) References Cited

U.S. PATENT DOCUMENTS

| | | | | |
|---|---|---|---|---|
| 5,144,747 A | * | 9/1992 | Eichelberger | 29/839 |
| 5,796,167 A | * | 8/1998 | Koga | 257/758 |
| 5,925,937 A | * | 7/1999 | Jost et al. | 257/797 |
| 6,137,186 A | * | 10/2000 | Jost et al. | 257/797 |
| 6,144,109 A | * | 11/2000 | Stanton et al. | 257/797 |
| 6,165,656 A | * | 12/2000 | Tomimatu | 430/22 |
| 6,198,149 B1 | * | 3/2001 | Ishigaki | 257/506 |
| 6,337,517 B1 | * | 1/2002 | Ohta et al. | 257/758 |

FOREIGN PATENT DOCUMENTS

| | | | | |
|---|---|---|---|---|
| JP | 10-163316 | | 6/1998 | |
| JP | 10-229085 | | 8/1998 | |
| JP | 11-126820 | | 5/1999 | |
| JP | 02001176968 A | * | 6/2001 | 257/758 |

* cited by examiner

*Primary Examiner*—Albert W. Paladini
*Assistant Examiner*—Lourdes Cruz
(74) *Attorney, Agent, or Firm*—McDermott, Will & Emery

(57) ABSTRACT

A transfer mark structure for a multi-layer interconnecting process for avoiding the influence of dishing when a groove pattern for multi-layer interconnection is formed, and for improving the accuracy and stability of reading the transfer mark used for transfer in the following step so as to align with a location of transfer in the preceding step, and a method for producing such a transfer mark for the multi-layer interconnecting process. The underlying layer 102 immediately under the transfer mark 22 for photoengraving formed in the step of connecting between interconnecting layers 16 has a groove-like pattern.

2 Claims, 10 Drawing Sheets

F I G. 1 4
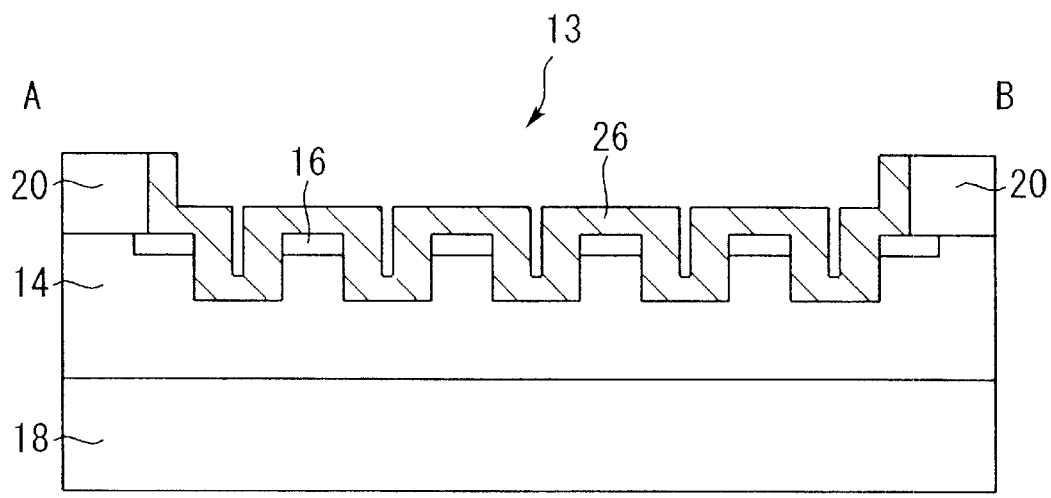
F I G. 1 5
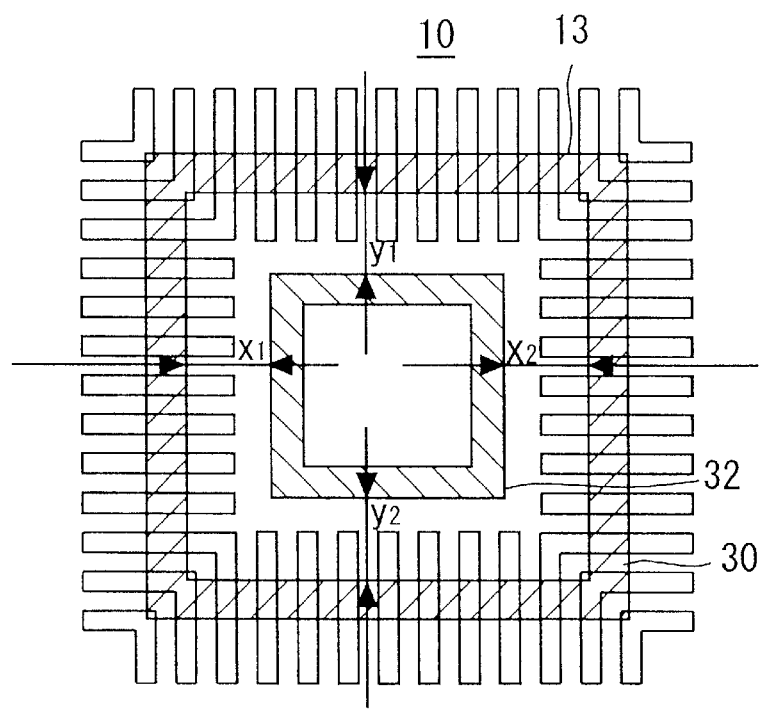
DEVIATION $\Delta X = x_1 - x_2$
DEVIATION $\Delta Y = y_1 - y_2$

TRANSFER MARK STRUCTURE FOR MULTI-LAYER INTERCONNECTING AND METHOD FOR THE MANUFACTURE THEREOF

BACKGROUND OF THE INVENTION

1. Field of the Invention

The present invention relates to a multi-layer interconnecting technique, and in particular to a transfer mark structure for the multi-layer interconnecting process for avoiding the effect of dishing on the formation of a groove-like pattern, and for increasing and stabilizing the reading accuracy of a transfer mark used for transfer in the following step so as to align with the transfer location in the preceding step; and a method for manufacturing such a transfer mark structure for the multi-layer interconnecting process.

2. Description of Related Art

Heretofore, in the manufacture of a semiconductor device using more than one transfer using masks, a transfer mark has been used for performing transfer in the following step so that the resist pattern is aligned to the resist pattern transferred in the previous step. As such a transfer mark, there is a reading mark for alignment by optically reading the pattern with transfer equipment, an alignment inspection mark for detecting misalignment of the resist pattern formed by transfer with the resist pattern formed in the previous step or the like. When a transfer mark is formed in the step of forming a contact hole for interconnecting multiple layers, an interconnecting layer is normally provided on the entire area under the transfer mark.

FIG. 16 shows a top view of an example. FIG. 16 is a top view for illustrating a first prior art transfer mark. Hatched areas are groove patterns 100 formed in the hole forming step of detecting locations in the right-left direction (horizontal direction) in the drawing. Under the groove patterns 100 is formed an underlying layer 102 having an interconnecting layer. Here, the width of the groove patterns 100 is, for example, about 0.5 $\mu$m, the repeating pitch of the groove patterns 100 is, for example, about 5–15 $\mu$m, and the length of the groove patterns 100 is, for example, about 50–100 $\mu$m.

In recent years, however, due to size reduction of electronic devices, it has been required for metal wiring to reduce the thickness of the wire and the distance between the wires to about 0.3 $\mu$m or less. The formation of a resist pattern on a metal film using the transfer technique is difficult due to halation caused by the high reflectivity, and a technique known as Damascene is used. The Damascene is a method for first forming groove patterns 100 on an insulation film such as silicon dioxide ($SiO_2$) corresponding to the shape of interconnection, and forming one or more conductive layers on the entire surface, followed by the removal of conductor layers other than the conductor layer in the groove patterns 100 using CMP (Chemical Mechanical Polishing).

Another prior art is, for example, the one disclosed in Japanese Patent Laid-Open No. 10-229085 (second prior art). The objects of the second prior art are to decrease the deterioration of flatness of pad interconnection due to dishing during CMP, and to perform the reliable test of semiconductor elements. The inventions of the second prior art are, a semiconductor device having a pad comprising a wide interconnection provided on the semiconductor device by the Damascene method, or a multi-layer interconnection structure on the interconnection, wherein a slit is provided in the plane region of the interconnection or each interconnection layer of the multi-layer interconnection structure; a semiconductor wafer having a pad comprising a multi-layer interconnection structure used as the probe of the test element group (TEG) of the semiconductor element electrically connected to the interconnection provided on the semiconductor device by the Damascene method, wherein a slit is provided in the plane region of each interconnection layer of the multi-layer interconnection structure; and a method for manufacturing a semiconductor device comprising the step of forming a pad of a multi-layer interconnection structure on the interconnection provided on the semiconductor device by using the Damascene method, further comprising the steps of forming a slit in the plane region of each interconnection layer of the multi-layer interconnection structure before dishing is performed in the Damascene method, and subjecting the structure having the slit formed in the plane region to chemical mechanical polishing for planarizing, and laminating one after the other. In such second prior art, when the pattern of the interconnection portion is wide in the interconnection structure by using the Damascene method, since the area to be polished is decreased in particular by providing a slit in the plane region of the pad used as the probe for TEG, and no depression is formed by the dishing effect, the deterioration of flatness of the pattern of the interconnection portion due to dishing during CMP may be decreased, thereby the flatness of the interconnection may be secured in the pad of the multi-layer interconnection structure by using the Damascene method, even if the pad of the test element group (TEG) for evaluating the quality of the semiconductor element in a uniform interconnection pattern is arranged on a large area as in conventional methods. Therefore, there is disclosed the effect that the test for evaluating the quality of the semiconductor element may be performed reliably.

However, the above-described prior art has the following problems. FIG. 17 is a sectional view of an element structure along the line C-D of FIG. 16 for illustrating dishing, which is a problem in the Damascene method, FIG. 18 is a sectional view of an element structure along the line E-F of FIG. 16 for illustrating dishing, which is a problem in the Damascene method, and FIGS. 19 through 22 are sectional views of an element structure along the line C-D of FIG. 16 for illustrating the problem of dishing. The first problem is that a wide groove pattern 100 (for example, about 50 $\mu$m or more) causes a phenomenon that the central portion becomes excessively concave (dishing) as FIGS. 17 and 18 show. The problem of dishing is consecutively shown in FIGS. 19 to 22. First, as FIG. 19 shows, an oxide film 104 in the portion forming the interconnection layer is etched. Next, as FIG. 20 shows, a metal film 106 of a single-layer or multi-layer structure is formed on the surface of the oxide film 104. As FIG. 21 shows, if the portion in the vicinity of the center of the oxide film 104 becomes concave during CMP, the shape of an insulation film layer 108 between interconnections formed thereon reflects a groove pattern 100 (see FIG. 22). If the mark for the hole forming step is formed on this insulation film layer 108, the depth of the groove pattern 100 at the end portions becomes different from the depth of the groove pattern 100 at the central portion as FIG. 18 shows, and any concave portion is produced, causing reading accuracy to be lowered. The second problem is that the surface of the resist becomes flat even when the transfer mark is transferred, thereby the thickness of the resist increases at the concave portion, that is the central portion, causing the accuracy of the pattern of the transfer mark to be lowered. The third problem is that when the multi-layer interconnection is produced in the following steps in the state where dishing has occurred, the concave portion caused by dishing remains, and various process-related problems caused by dishing may occur.

On the other hand, there is another prior art in which no underlying metal film 106 is provided as FIG. 23 shows (the third prior art). FIG. 23 is a top view of an element for illustrating a transfer mark of the third prior art, and FIG. 24 is a sectional view of the element structure along the line E-F of FIG. 23. Although the above-described problem of dishing can be avoided when no underlying metal film 106 is provided as FIG. 23 shows, the depth H of the groove pattern 100 (see FIG. 24) varies on the surface of a wafer, or between wafers, and the transfer mark cannot be read stably, arising the problem that the accuracy of alignment is not stabilized.

SUMMARY OF THE INVENTION

In order to solve the above-described problems, the object of the present invention is to avoid the effect of dishing when the groove pattern for multi-interconnection is formed; to provide a transfer mark structure for the multi-layer interconnecting process for enhancing the accuracy and stability of reading the transfer mark used for transferring the resist pattern of the following step so as to align to the location of the pattern transferred in the preceding step; and to provide a method for producing a transfer mark for the multi-layer interconnecting process.

According to a first aspect of the present invention, there is provided a transfer mark structure for a multi-layer interconnecting process for avoiding an effect of dishing on formation of a groove-like pattern for a multi-layer interconnecting, and for increasing and stabilizing reading accuracy of a transfer mark used for transfer in the following step so as to align with a transfer location in the preceding step, wherein an underlying layer immediately under the transfer mark for photoengraving formed in a step of connecting interconnecting layers has the groove-like pattern.

According to a second aspect of the present invention, there is provided a transfer mark structure for a multi-layer interconnecting process for avoiding an effect of dishing on formation of a groove-like pattern for a multi-layer interconnecting, and for increasing and stabilizing reading accuracy of a transfer mark used for transfer in the following step so as to align with a transfer location in the preceding step, wherein the transfer mark for photoengraving comprises a pattern having grooves in two directions intersecting perpendicularly to each other, and a direction of grooves of the interconnecting layer comprises a pattern having grooves in two directions intersecting perpendicularly to the pattern having grooves of the transfer mark for photoengraving.

According to a third aspect of the present invention, there is provided a method for producing a transfer mark for a multi-layer interconnecting process for avoiding an effect of dishing on formation of a groove-like pattern for a multi-layer interconnecting, and for increasing and stabilizing reading accuracy of a transfer mark used for transfer in the following step so as to align with a transfer location in the preceding step, comprising the step of: forming a groove-like pattern in an underlying layer immediately under the transfer mark for photoengraving formed in a step of connecting interconnecting layers.

The above and other objects, effects, features and advantages of the present invention will become more apparent from the following description of the embodiments thereof taken in conjunction with the accompanying drawings.

BRIEF DESCRIPTION OF THE DRAWINGS

FIG. 14 is a sectional view of the element structure along the line A-B in FIG. 1 for illustrating the method for producing a transfer mark for the multi-layer interconnecting process according to the Embodiment 2 of the present invention (when the groove-like pattern 12 is not filled when the overlying interconnecting layer 26 (conductor) is deposited).

FIG. 15 is a top view of a transfer mark structure 10 for the multi-layer interconnecting process according to the Embodiment 3 of the present invention.

FIG. 16 is a top view for illustrating a first prior art transfer mark.

FIG. 17 is a sectional view of an element structure along the line C-D of FIG. 16 for illustrating dishing, which is a problem in the Damascene method.

FIG. 18 is a sectional view of an element structure along the line E-F of FIG. 16 for illustrating dishing, which is a problem in the Damascene method.

DETAILED DESCRIPTION OF THE PREFERRED EMBODIMENTS

Figure 1:
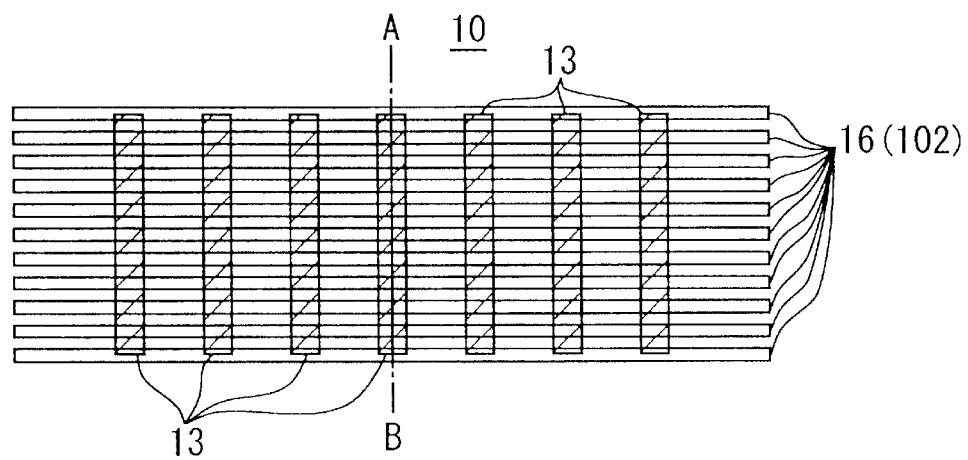
FIG. 1 is a top view of a transfer mark structure 10 for a multi-layer interconnecting process according to the Embodiment 1 of the present invention.

Embodiments of the present invention will be described below with reference to the accompanying drawings. It is noted that the same reference symbols in the drawings denote the same or corresponding components.

Embodiment 1

Figure 2:
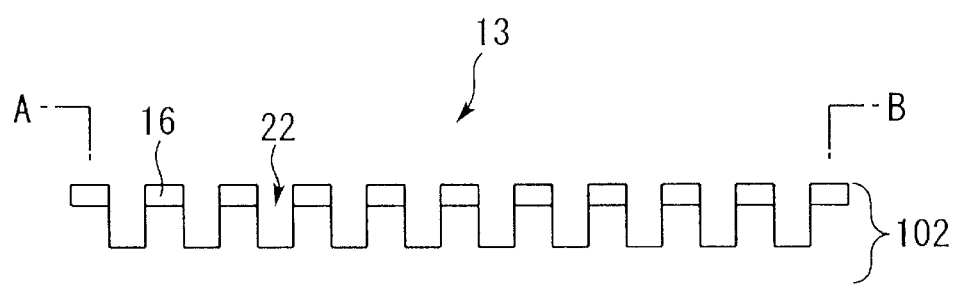
FIG. 2 shows a sectional view of an element along the line A-B in FIG. 1 immediately after processing of the transfer mark 22 has been performed.

The Embodiment 1 of the present invention will be described in detail below referring to the drawings. FIG. 1 is a top view of a transfer mark structure 10 for a multi-layer interconnecting process according to the Embodiment 1 of the present invention. Referring to FIG. 1, in the transfer mark structure 10 for the multi-layer interconnecting process according to this embodiment, an underlying layer 102 similar to the underlying layer in prior art (see FIG. 16) is provided under hole patterns 13 indicated by oblique lines, and an interconnecting layer 16 is formed on the underlying layer 102. However, while the interconnecting layer 16 is a region comprising one rectangle in prior art (see FIG. 16), this embodiment is characterized in thin lines arranged equidistantly. FIG. 2 shows a sectional view of an element along the line A-B in FIG. 1 immediately after processing of the transfer mark 22 has been performed.

Figure 3:
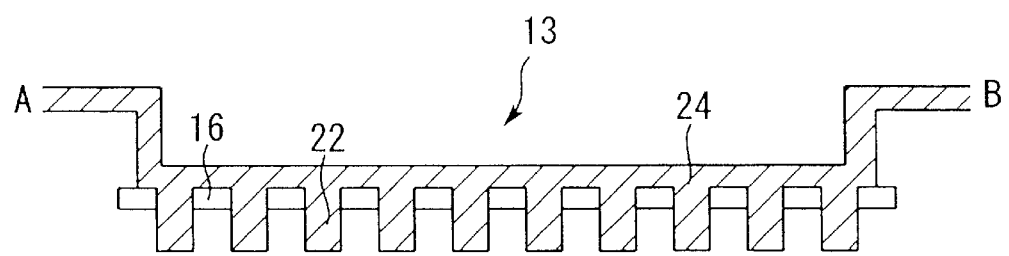
FIG. 3 shows the state after a conductor (conductor film 24) for embedding the pattern 13 after the transfer mark 22 is formed.

Next, FIG. 3 shows the state after a conductor (conductor film 24) for embedding the hole pattern 13 after the transfer mark 22 is formed. Referring to FIG. 3, the transfer mark structure 10 for the multi-layer interconnecting process according to this embodiment is configurated so as to embed the transfer mark 22 between interconnecting layers 16 with a conductor connecting between interconnections (conductor film 24 of this embodiment described later, see FIG. 9). The height up to the bottom of the transfer mark 22 is thereby determined uniquely, resulting in the effect of realizing the stabilization of reading the transfer mark 22 in following steps.

Figure 4:
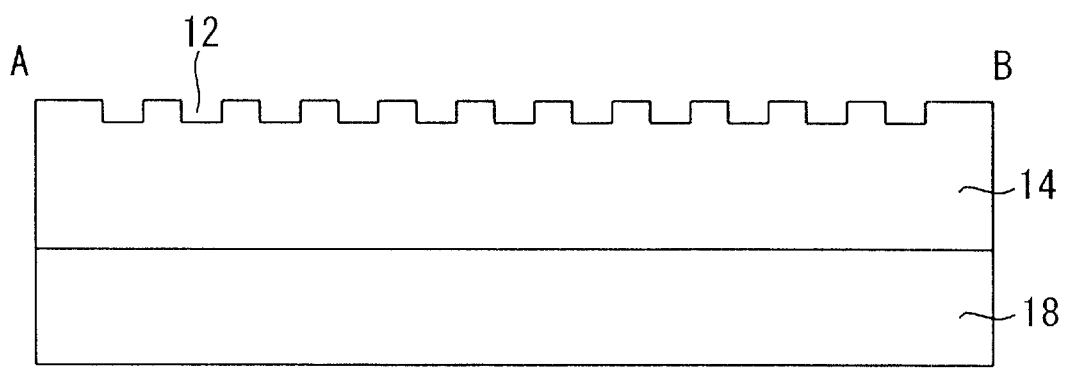
FIG.4 is a sectional view of an element structure along the line A-B in FIG. 1 for illustrating the first step of a method for producing a transfer mark for the multi-layer interconnecting process according to the Embodiment 1 of the present invention.
Figure 5:
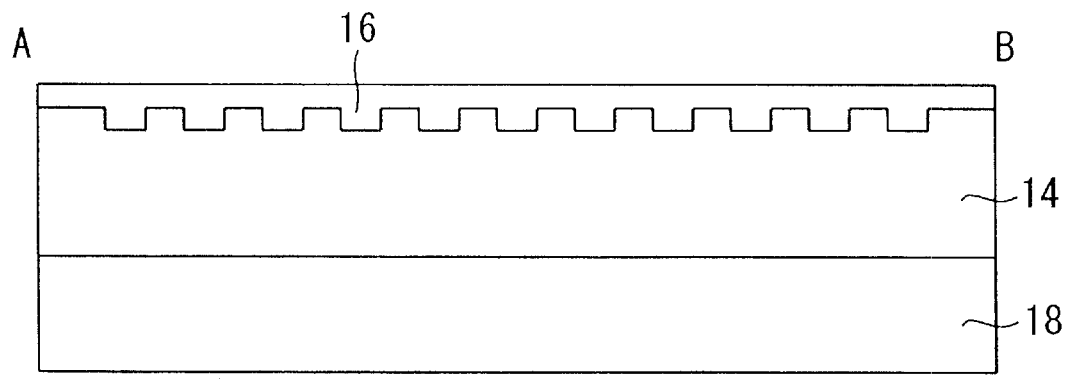
FIG. 5 is a sectional view of an element structure along the line A-B in FIG. 1 for illustrating the second step of a method for producing a transfer mark for the multi-layer interconnecting process according to the Embodiment 1 of the present invention
Figure 6:
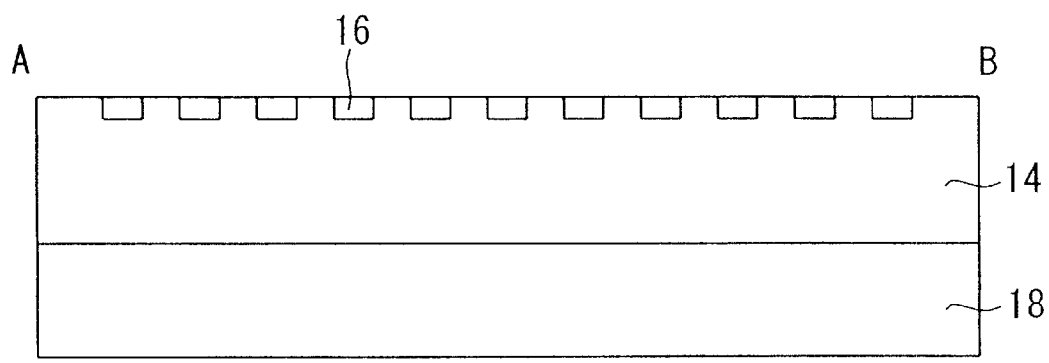
FIG. 6 is a sectional view of an element structure along the line A-B in FIG. 1 for illustrating the third step of a method for producing a transfer mark for the multi-layer interconnecting process according to the Embodiment 1 of the present invention.
Figure 7:
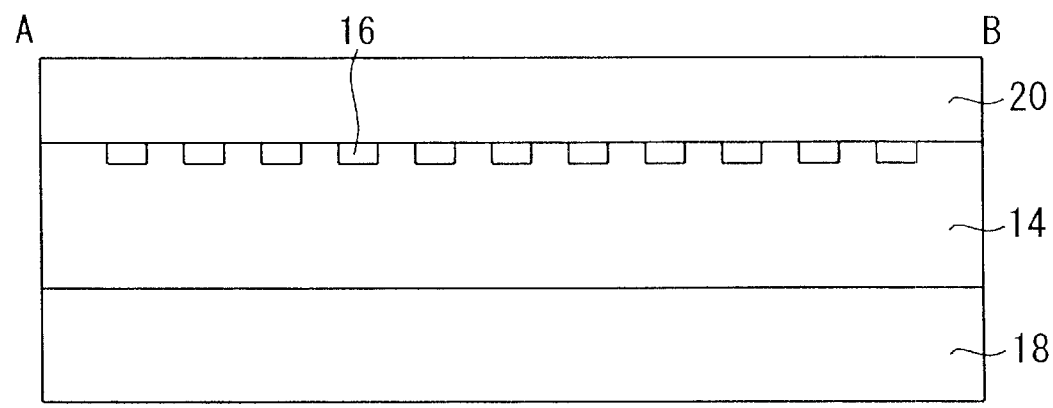
FIG. 7 is a sectional view of an element structure along the line A-B in FIG. 1 for illustrating the fourth step of a method for producing a transfer mark for the multi-layer interconnecting process according to the Embodiment 1 of the present invention.
Figure 8:
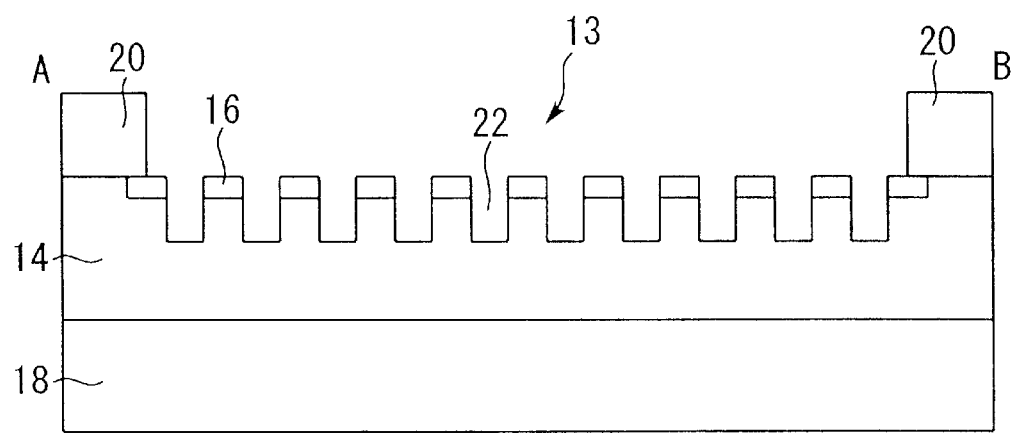
FIG. 8 is a sectional view of an element structure along the line A-B in FIG. 1 for illustrating the fifth step of a method for producing a transfer mark for the multi-layer interconnecting process according to the Embodiment 1 of the present invention.
Figure 9:
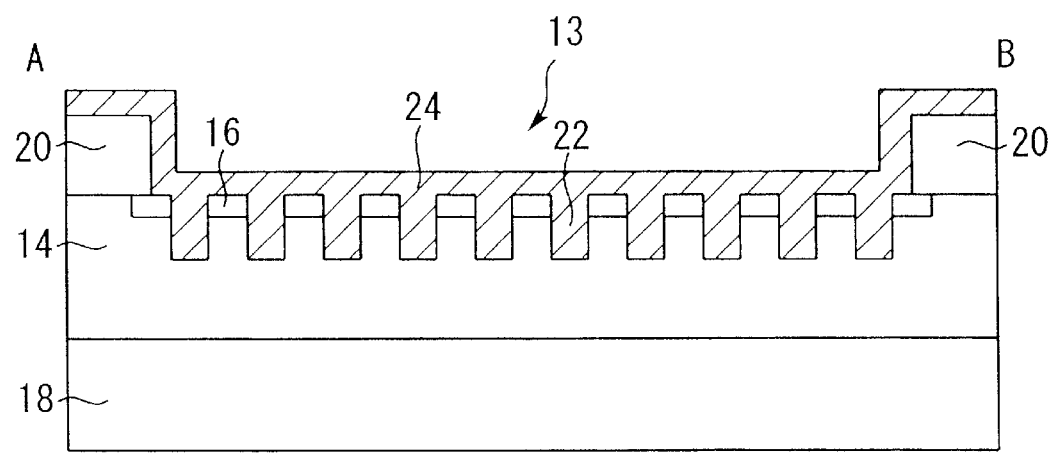
FIG. 9 is a sectional view of an element structure along the line A-B in FIG. 1 for illustrating the sixth step of a method for producing a transfer mark for the multi-layer interconnecting process according to the Embodiment 1 of the present invention.
Figure 10:
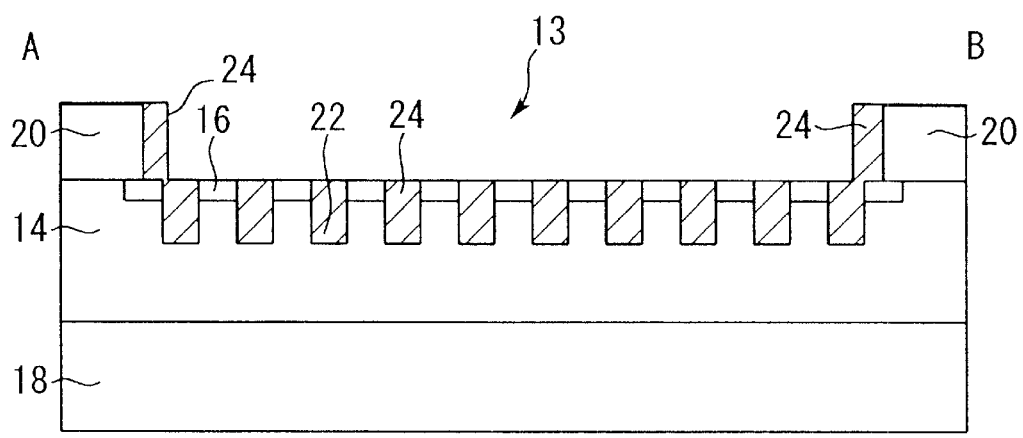
FIG. 10 is a sectional view of an element structure along the line A-B in FIG. 1 for illustrating the seventh step of a method for producing a transfer mark for the multi-layer interconnecting process according to the Embodiment 1 of the present invention.
Figure 11:
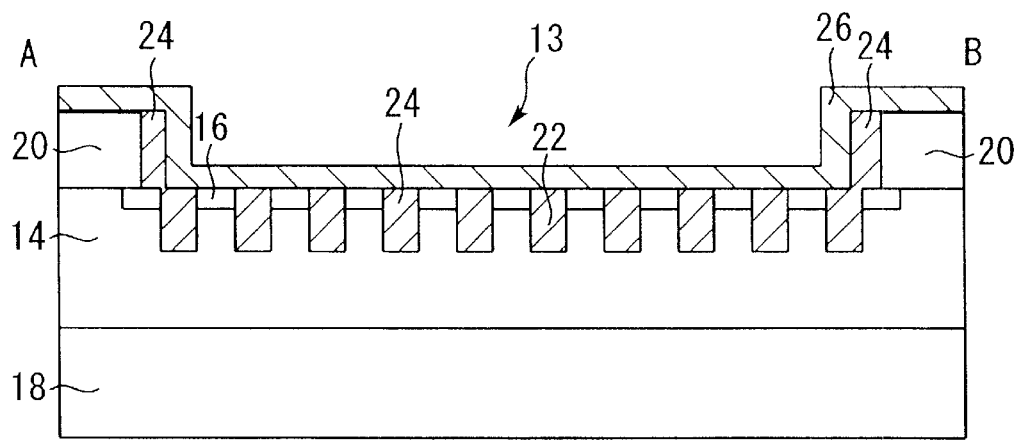
FIG. 11 is a sectional view of an element structure along the line A-B in FIG. 1 for illustrating the eighth step of a method for producing a transfer mark for the multi-layer interconnecting process according to the Embodiment 1 of the present invention.

Referring next to sectional views along the lines A-B in FIGS. 4 through 11, the procedures of producing the transfer mark 22 of this embodiment (a method for producing a transfer mark for the multi-layer interconnecting process) will be described. FIG. 4 is a sectional view of an element structure along the line A-B in FIG. 1 for illustrating the first step of a method for producing a transfer mark for the multi-layer interconnecting process according to the Embodiment 1 of the present invention; FIG. 5 is a sectional view of an element structure along the line A-B in FIG. 1 for illustrating the second step of a method for producing a transfer mark for the multi-layer interconnecting process according to the Embodiment 1 of the present invention; FIG. 6 is a sectional view of an element structure along the line A-B in FIG. 1 for illustrating the third step of a method for producing a transfer mark for the multi-layer interconnecting process according to the Embodiment 1 of the present invention; FIG. 7 is a sectional view of an element structure along the line A-B in FIG. 1 for illustrating the fourth step of a method for producing a transfer mark for the multi-layer interconnecting process according to the Embodiment 1 of the present invention; FIG. 8 is a sectional view of an element structure along the line A-B in FIG. 1 for illustrating the fifth step of a method for producing a transfer mark for the multi-layer interconnecting process according to the Embodiment 1 of the present invention; FIG. 9 is a sectional view of an element structure along the line A-B in FIG. 1 for illustrating the sixth step of a method for producing a transfer mark for the multi-layer interconnecting process according to the Embodiment 1 of the present invention; FIG. 10 is a sectional view of an element structure along the line A-B in FIG. 1 for illustrating the seventh step of a method for producing a transfer mark for the multi-layer interconnecting process according to the Embodiment 1 of the present invention; and FIG. 11 is a sectional view of an element structure along the line A-B in FIG. 1 for illustrating the eighth step of a method for producing a transfer mark for the multi-layer interconnecting process according to the Embodiment 1 of the present invention. Referring to FIG. 4, the first step is first carried out to form an equidistant groove-like pattern on the surface of an insulating film 14 (for example, $SiO_2$ film (silicon dioxide film) on an Si substrate (silicon substrate) by using photoengraving (or photographical plate making, hereinafter referred to as "photoengraving") and dry etching.

Next, as FIG. 5 shows, the second step is carried out to form an interconnecting layer 16 comprising one or more conductors on the equidistantly formed groove-like pattern 12. Next, as FIG. 6 shows, the third step is carried out to perform CMP leaving the conductor (interconnecting layer 16) only inside the groove-like pattern 12. At this time, since the upper surface of the groove-like pattern 12 formed by the insulating film 14 on the Si substrate 18 is not as wide as that in prior art, the occurrence of dishing on the polished surfaces of the insulating film 14 and the interconnecting layer 16 can be prevented even when the interconnecting layer 16 is subjected to CMP, resulting in the effect of forming flat surfaces.

Next, as FIG. 7 shows, the fourth step is carried out to form an interlayer insulating film 20 (for example, an $SiO_2$ (silicon dioxide) film) on the insulating film 14 and the interconnecting film 16 that have been subjected to CMP so as to leave the conductor (interconnecting layer 16) only inside (on the internal portion) of the groove-like pattern 12. As described above, since the occurrence of dishing on the polished surface of the insulating film 14 and the interconnecting film 16 can be prevented in the third step, the surface of the interlayer insulating film 20 can also be flattened. Next, as FIG. 8 shows, the fifth step (hole forming step) is carried out to form a hole pattern 13 using photoengraving and dry etching. At this time, a precision hole pattern 13 can be formed because photoengraving is performed on the surface of the flat interlayer insulating film 20.

In the dry etching of the interlayer insulating film 20 and the insulating film 14 in the fifth step (hole forming step), since the dry etching is normally performed a little excessively, considering variation of the thickness of the interlayer insulating film 20 on the interconnecting film 16, or variation of the speed of dry etching the interlayer insulating film 20 and the insulating film 14, the area between interconnecting layers 16 may more or less be etched as FIG. 8 shows.

Next, as FIG. 9 shows, the sixth step (step for embedding the hole pattern 13) is carried out to form a conductor film 24 for embedding the hole pattern 13 (for example, to form a conductor film 24 on the entire surface). Next, as FIG. 10 shows, the seventh step is carried out to etch the entire area inside the hole pattern 13 using dry etching. Next, as FIG. 11 shows, the eighth step is carried out to deposit an upper interconnecting layer 26 (conductor) on the conductor film 24 and the interconnecting layer 16 within the hole pattern 13, and to perform photoengraving. At this time, if the gaps in the groove-like pattern 12 of the interconnecting layer 16 are completely filled after the sixth step (step for embedding the hole pattern 13) has been carried out, as shown in FIG. 11, the bottom of the hole pattern 13 is substantially flat, increasing the accuracy of reading the transfer mark 22. Namely, the establishment of the gaps in the groove-like pattern 12 of the interconnecting layer 16 so that the gaps in the groove-like pattern 12 of the interconnecting layer 16 are completely filled in the sixth step (step for embedding the hole pattern 13) facilitates the reading of the transfer mark 22.

Embodiment 2

Figure 12:
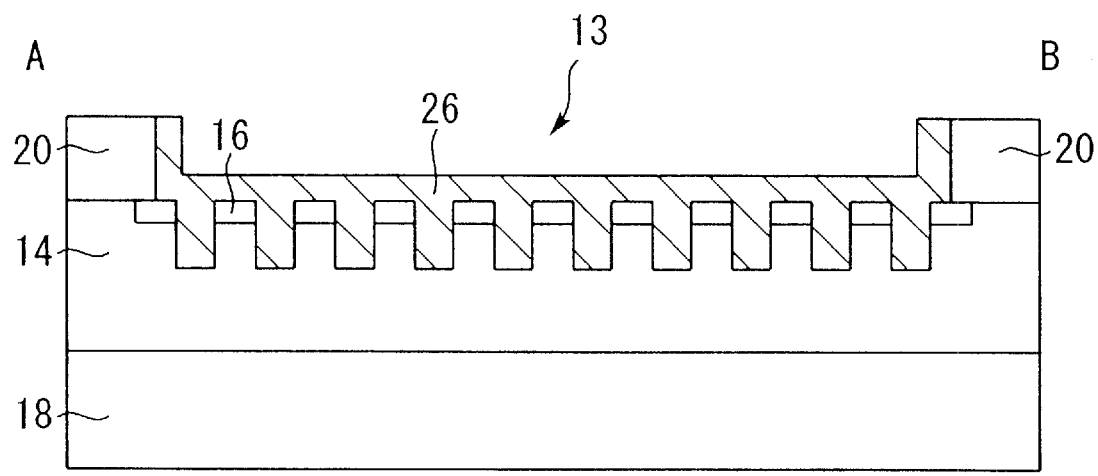
FIG. 12 is a sectional view of the element structure along the line A-B in FIG. 1 for illustrating the method for producing a transfer mark for the multi-layer interconnecting process according to the Embodiment 2 of the present invention (when transfer mark 22 is read using difference in height).
Figure 13:
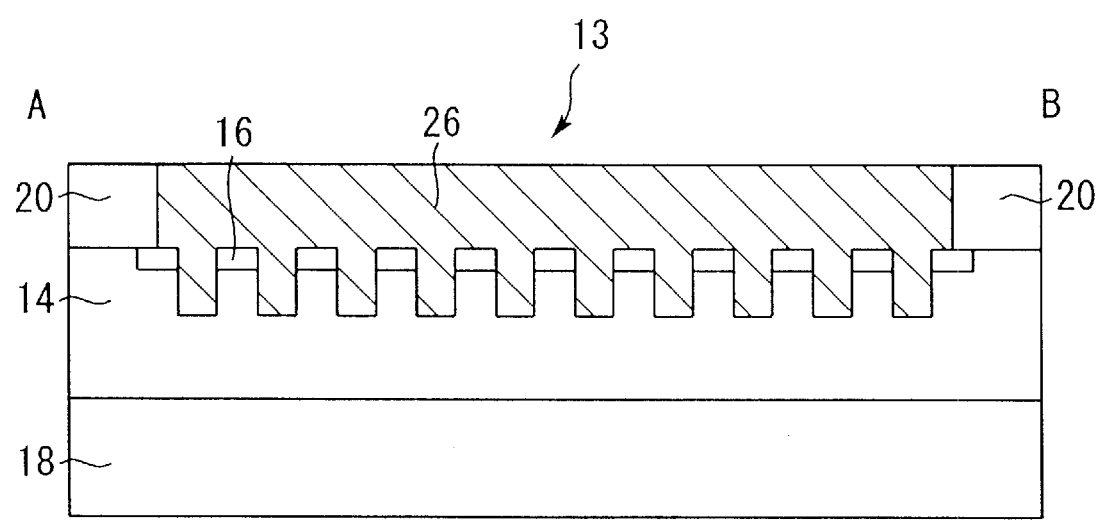
FIG. 13 is sectional view of the element structure along the line A-B in FIG. 1 for illustrating the method for producing a transfer mark for the multi-layer interconnecting process according to the Embodiment 2 of the present invention (when the transfer mark 22 is read by only the contrast viewed from the top).
Figure 1:
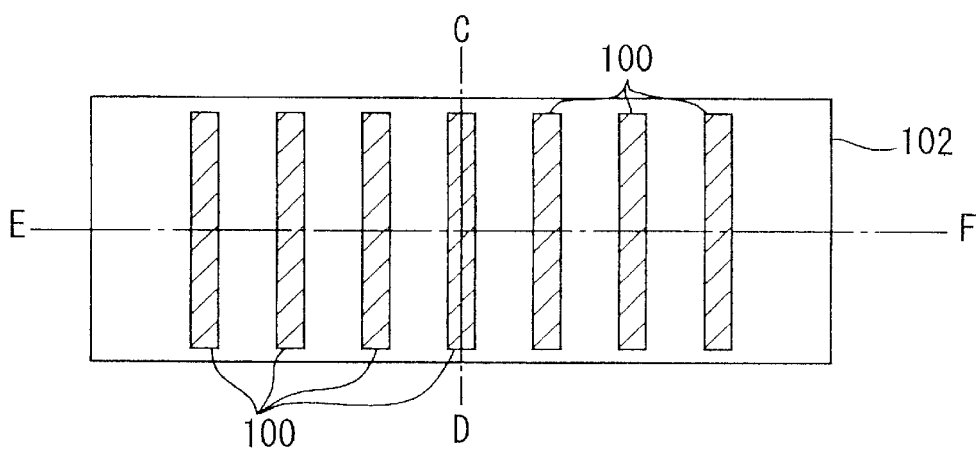
Figure 1:
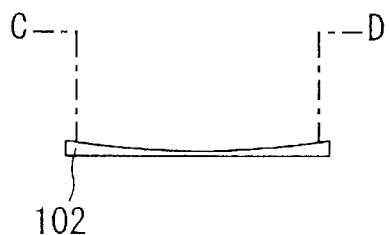
Figure 1:
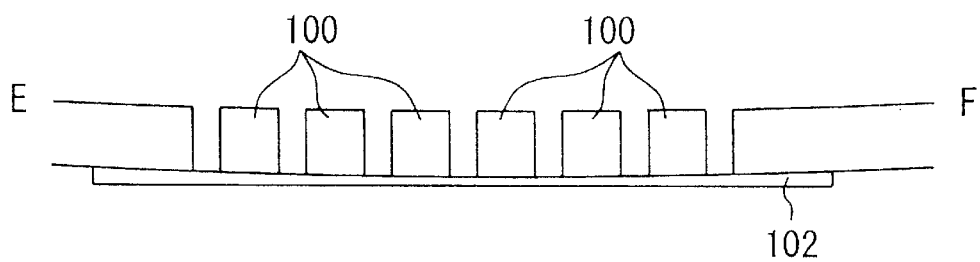
Figure 19:
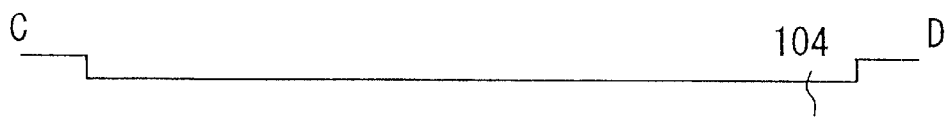
FIGS. 19 through 22 are sectional views of an element structure along the line C-D of FIG. 16 for illustrating the problem of dishing.
Figure 20:
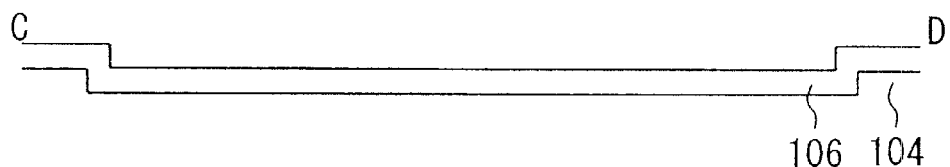
Figure 21:
Figure 22:
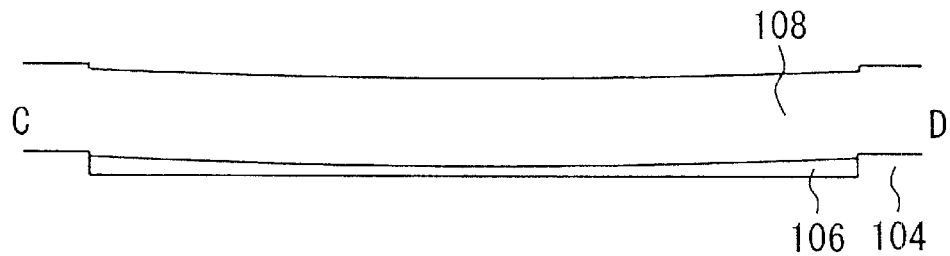
Figure 23:
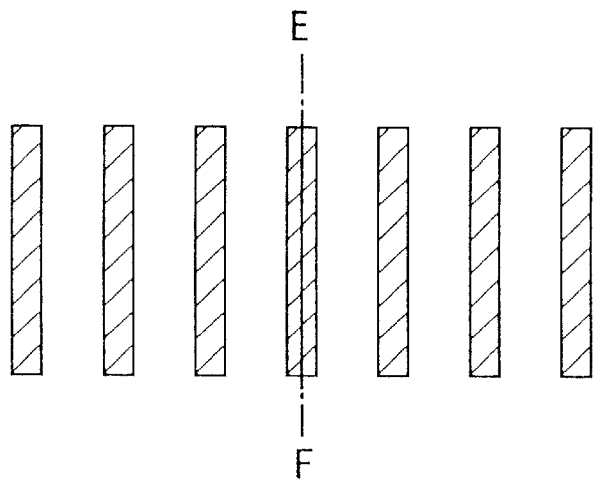
FIG. 23 is a top view of an element for illustrating a transfer mark of the third prior art.
Figure 24:
FIG. 24 is a sectional view of the element structure along the line E-F of FIG. 23.

The Embodiment 2 of the present invention will be described in detail below referring to the drawings. In this embodiment, an example in which the Damascene method is used on the upper layer of the transfer mark 22 produced in the above-described Embodiment 1. Referring to sectional views along lines A-B of FIGS. 12–14, the method for producing a transfer mark for the multi-layer interconnecting process according to the Embodiment 2 of the present invention will be described. FIG. 12 is a sectional view of the element structure along the line A-B in FIG. 1 for illustrating the method for producing a transfer mark for the multi-layer interconnecting process according to the Embodiment 2 of the present invention (when the transfer mark 22 is read using difference in height); FIG. 13 is a sectional view of the element structure a long the line A-B in FIG. 1 for illustrating the method for producing a transfer mark for the multi-layer interconnecting process according to the Embodiment 2 of the present invention (when the transfer mark 22 is read by only the contrast viewed from the top); and FIG. 14 is a sectional view of the element structure along the line A-B in FIG. 1 for illustrating the method for producing a transfer mark for the multi-layer interconnecting process according to the Embodiment 2 of the present invention (when the groove-like pattern 12 is not filled when the overlying interconnecting layer 26 (conductor) is deposited). First, referring to FIG. 12, when the transfer mark 22 is read using difference in height, (when the transfer mark 22 is to be read in the following step using difference in height in the state where the transfer mark 22, which is a groove in the interconnecting layer 16, is filled, but the hole pattern 13 formed in the fifth step (hole forming step) is not filled), the A-B cross-section as shown in FIG. 12 must be formed. It is required for this that the size of the gap in the groove-like pattern 12 of the interconnecting layer 16 is the size which can be filled by the overlying interconnecting layer 26 (conductor) (specifically, twice the thickness of the overlying interconnecting layer 26 or less), and that the size of the hole pattern 13 formed in the fifth step (hole forming step) is the size which can be filled by the overlying interconnecting layer 26 (conductor) (specifically, twice the thickness of the overlying interconnecting layer 26 plus the size required for reading). In this embodiment, the size required for reading is about 1 µm.

Next, when the transfer mark 22 is read only by the contrast viewed from the top (when the hole pattern 13 formed in the fifth step (hole forming step) is narrow, and transfer mark 22 is read from the reflection of the surface in the state where the transfer mark 22 is filled by the overlying interconnecting layer 26 (conductor)), the A-B cross-section as shown in FIG. 13 must be formed. It is required for this that the size of the hole pattern 13 formed in the fifth step (hole forming step) is the size filled by the overlying interconnecting layer 26 (conductor) (specifically, twice the thickness of the overlying interconnecting layer 26 or less). When the entire pattern is embedded as shown in FIG. 13, a conventional transfer mark having the interconnecting layer 16 on the entire surface is difficult to take contrast with the underlying interconnecting layer 16. Whereas, since the interconnecting layer 16, has the shape in which thin lines are arranged in this embodiment, this embodiment has the effect of securing contrast with the transfer mark 22 even in the sixth step (step for embedding the hole pattern 13) for embedding the entire pattern.

Also, if the groove-like pattern 12 of the interconnecting layer 16 is not embedded when the overlying interconnecting layer 26 (conductor) is deposited because the gap of the groove-like pattern 12 of the interconnecting layer 16 is wide, the shape as shown in FIG. 14 is formed, and the groove-like pattern 12 cannot be read.

According to the Embodiment 2 as described above, the same effect as in the Embodiment 1 may be obtained when CMP is performed after the hole pattern 13 has been formed in the fifth step (hole forming step) and the groove-like pattern 12 has been formed in the area where the overlying interconnecting layer is formed, in the state where a conductor is embedded both in the groove-like pattern 12 for interconnection and inside the contact at the same time. At this time, in photoengraving for the overlying interconnecting layer 26 (conductor), the transfer mark 22 inside the hole pattern 13 formed in the fifth step (hole forming step) is read. Since metals such as aluminum and copper are chiefly used in the interconnecting layer 16, the interconnecting layer 16 having a high reflectivity on the bottom of the hole pattern 13 is clearly identified. Since the depth of the interconnecting layer 16 is constant throughout the entire transfer mark 22, the effect of realizing accurate reading is obtained. The cross-sectional structure after forming the overlying interconnecting layer 26 (conductor) can be altered by the width of the groove-like pattern 12 of the transfer mark 22.

Embodiment 3

The Embodiment 3 of the present invention will be described in detail below referring to the drawings. FIG. 15 is a top view of a transfer mark structure 10 for the multi-layer interconnecting process according to the Embodiment 3 of the present invention. Referring to FIG. 15, the transfer mark structure 10 for the multi-layer interconnecting process according to this embodiment is characterized in that a transfer mark 22 is provided for measuring misalignment of the hole pattern 13 formed in the above-described fifth step (hole forming step) from an interconnecting layer 16 formed in the following step. For example, if the outer square interconnecting layer 30 is assumed to be the groove-like pattern 12 formed in the fifth step (hole forming step), and the inner square interconnecting layer 32 is assumed to be the resist pattern formed in the following interconnecting step, deviation ΔX (=x1−x2) can be calculated on the basis of the distances between the groove-like pattern 12 shown in FIG. 14 and the resist pattern in the x direction (horizontal direction, or the left-right direction on FIG. 15), x1 and x2, and deviation ΔY (=y1−y2) can be calculated on the basis of the distances between the groove-like pattern 12 shown in FIG. 14 and the resist pattern in the y direction (vertical direction, or the up-down direction on FIG. 15), y1 and y2.

According to the above-described Embodiment 1, the transfer mark 22 is formed as a groove-like pattern 12 in a single direction, and the interconnecting layer 16 is formed in another single direction so as to intersect perpendicularly to the transfer mark 22. On the other hand, this embodiment is characterized in that a pattern always intersecting perpendicularly to the transfer mark 22 in the hole step is formed instead of the groove-like pattern as in the Embodiment 1, because the transfer mark 22 is formed in two directions intersecting perpendicularly to each other (that is, x direction (horizontal direction) and y direction (vertical direction)). The effect obtained in this embodiment is the same as in the Embodiment 1 or the Embodiment 2.

As described above, each of the above embodiments has the following effects. The first effect is that the effect of dishing can be avoided when a groove-like pattern for multi-layer interconnection is formed. The second effect is that the reading accuracy of a transfer mark used for transfer in the following step so as to align with the transfer location in the preceding step an be increased and stabilized.

It is obvious that the present invention is not limited to the above-described embodiments, but each of the embodiments can be modified adequately within the scope of the spirit of the present invention. Also, the numbers, locations, or shapes are not limited to the above-described embodiments, but suitable numbers, locations, or shapes can be adopted for carrying out the present invention. In the drawings, the same symbols are used for the same components.

According to a first aspect of the present invention, as described above, since there is provided a transfer mark structure for a multi-layer interconnecting process for avoiding an effect of dishing on formation of a groove-like pattern for a multi-layer interconnecting, and for increasing and stabilizing reading accuracy of a transfer mark used for transfer in the following step so as to align with a transfer location in the preceding step, wherein an underlying layer immediately under the transfer mark for photoengraving formed in a step of connecting interconnecting layers has the groove-like pattern, the following effect may be obtained. The first effect may be that the effect of dishing may be avoided when a groove-like pattern for multi-layer interconnection is formed. The second effect may be that the reading accuracy of a transfer mark used for transfer in the following step so as to align with the transfer location in the preceding step may be increased and stabilized.

As described above, in the transfer mark structure for the multi-layer interconnecting process, since the groove-like pattern may have a shape where equidistant grooves are repeated, the effect of securing contrast with the transfer mark may be obtained even when the pattern is completely embedded, in addition to the effect of the above-described invention.

As described above, in the transfer mark structure for the multi-layer interconnecting process, since the transfer mark for photoengraving may be composed of a parallel groove-like pattern, and the groove-like pattern of the interconnecting layer under the transfer mark for photoengraving may be composed of parallel grooves perpendicularly intersecting the transfer mark for photoengraving, the effect of securing contrast with the transfer mark may be obtained even when the pattern is completely embedded, in addition to the effect of the above-described inventions.

As described above, in the transfer mark structure for the multi-layer interconnecting process, since the groove-like pattern of the interconnecting layer may have a width of gaps completely filled by the step for filling the gaps between the interconnecting layers, the effect that the cross-sectional structure after forming the overlying interconnecting layer may be altered by the width of the groove-like pattern of the transfer mark may be obtained, in addition to the effect of the above-described inventions.

As described above, in the transfer mark structure for the multi-layer interconnecting process, since the underlying layer may be formed underneath a hole pattern, and the interconnecting layer of a shape where this wires are equidistantly arranged may be formed in the underlying layer, the same effect as in the above-described inventions.

As described above, in the transfer mark structure for the multi-layer interconnecting process, since the transfer mark between the interconnecting layers may be buried by the conductive film for connecting the interconnecting layers, the effect of realizing the stabilization of transfer mark reading in the following steps, resulted from the unique determination of the height up to the bottom of the transfer mark, in addition to the effect of the above-described inventions.

According to a second aspect of the present invention, as described above, since there is provided a transfer mark structure for a multi-layer interconnecting process for avoiding an effect of dishing on formation of a groove-like pattern for a multi-layer interconnecting, and for increasing and stabilizing reading accuracy of a transfer mark used for transfer in the following step so as to align with a transfer location in the preceding step, wherein the transfer mark for photoengraving may comprise a pattern having grooves in two directions intersecting perpendicularly to each other, and a direction of grooves of the interconnecting layer may comprise a pattern having grooves in two directions intersecting perpendicularly to the pattern having grooves of the transfer mark for photoengraving, the following effect may be obtained. The first effect is that the effect of dishing may be avoided when a groove-like pattern for multi-layer interconnection is formed. The second effect is that the reading accuracy of a transfer mark used for transfer in the following step so as to align with the transfer location in the preceding step may be increased and stabilized.

As described above, in the transfer mark structure for the multi-layer interconnecting process, since each of the groove-like patterns in two directions may have a shape where equidistant grooves are repeated, the effect of securing contrast with the transfer mark may be obtained even when the pattern is completely embedded, in addition to the effect of the above-described invention.

As described above, in the transfer mark structure for the multi-layer interconnecting process, since the transfer mark for photoengraving may be composed of a parallel groove-like pattern, and the groove-like pattern of the interconnecting layer under the transfer mark for photoengraving may be composed of parallel grooves perpendicularly intersecting each of the groove-like patterns in two directions, the effect of securing contrast with the transfer mark may be obtained even when the pattern is completely embedded, in addition to the effect of the above-described inventions.

As described above, in the transfer mark structure for the multi-layer interconnecting process, since the groove-like pattern of the interconnecting layer may have a width of gaps completely filled by the step for filling the gaps between the interconnecting layers, the effect that the cross-sectional structure after forming the overlying interconnecting layer may be altered by the width of the groove-like pattern of the transfer mark may be obtained, in addition to the effect of the above-described inventions.

According to a third aspect of the present invention, as described above, since there is provided a method for producing a transfer mark for a multi-layer interconnecting process for avoiding an effect of dishing on formation of a groove-like pattern for a multi-layer interconnecting, and for increasing and stabilizing reading accuracy of a transfer mark used for transfer in the following step so as to align with a transfer location in the preceding step, comprising the step of: forming a groove-like pattern in an underlying layer immediately under the transfer mark for photoengraving formed in a step of connecting interconnecting layers., the following effect may be obtained. The first effect may be that the effect of dishing may be avoided when a groove-like pattern for multi-layer interconnection is formed. The second effect may be that the reading accuracy of a transfer mark used for transfer in the following step so as to align with the transfer location in the preceding step may be increased and stabilized.

As described above, since the method for producing a transfer mark for the multi-layer interconnecting process may further comprise a step for forming a pattern having a shape where equidistant grooves are repeated, the effect of securing contrast with the transfer mark may be obtained even when the pattern is completely embedded, in addition to the effect of the above-described invention.

As described above, since the method for producing a transfer mark for the multi-layer interconnecting process may further comprise a step for forming a parallel groove-like pattern as the transfer mark for photoengraving, and a step for forming parallel grooves intersecting perpendicularly to the groove-like pattern of the interconnecting layer as the groove-like pattern of the interconnecting layer under the transfer mark for photoengraving, the effect of securing contrast with the transfer mark may be obtained even when the pattern is completely embedded, in addition to the effect of the above-described inventions.

As described above, since the method for producing a transfer mark for the multi-layer interconnecting process may further comprise a step for controlling the width of the interconnecting layer to a width completely filled by the step for filling the gaps between the interconnecting layers, the effect that the cross-sectional after forming the overlying interconnecting layer may be altered by the width of the groove-like pattern of the transfer mark may be obtained, in addition to the effect of the above- described inventions.

As described above, since the method for producing the transfer mark for the multi-layer interconnecting process may further comprise: a first step of forming the groove-like pattern equidistantly on the surface of an insulation film on a substrate using photoengraving and dry etching; a second step of forming the interconnecting layer comprising at least a layer of conductor on the equidistantly formed groove-like pattern; a third step of performing CMP treatment so that the interconnecting layer is left only inside the groove-like pattern; a fourth step of forming an interlayer insulation film on the insulation film and the interconnecting layer after the CMP treatment is performed so that the interconnecting layer is left only inside the groove-like pattern; a fifth step of forming a hole pattern using photoengraving and dry etching; a sixth step of forming a conductor film for filling the hole pattern; a seventh step of entirely dry etching the inside of the hole pattern; and an eighth step of photoengraving by depositing an upper interconnecting layer on the conductor film and the interconnecting layer inside the hole pattern., the effect of preventing the occurrence of dishing on the polished surface of the insulating film and the interconnecting layer may be obtained by carrying out the first to third steps, even when the interconnecting layer is subjected to CMP, because the upper surface of the groove-like pattern comprising the insulating film on the substrate, resulting in the formation of a flat surface, in addition to the effect of the above mentioned invention. Furthermore, by carrying out the fourth and fifth steps, a precision hole pattern may be formed because photoengraving is performed on the surface of the flat interlayer insulating film. Furthermore, by carrying out the sixth to eighth steps, if the gap of the groove-like pattern of the interconnecting layer is completely filled after carrying out the sixth step (hole pattern embedding step), the bottom of the hole pattern becomes substantially flat, resulting in the high accuracy of reading the transfer mark. Namely, by designing the gap of the groove-like pattern of the interconnecting layer so that the gap of the groove-like pattern of the interconnecting layer is completely filled in the sixth step (hole pattern embedding step), the reading of the transfer mark may be facilitated.

As described above, since the method for producing the transfer mark for the multi-layer interconnecting process, when the transfer mark is read using difference in level in the state wherein the transfer mark of grooves between the interconnecting layers is filled and the hole pattern formed in the fifth step is not filled, may further comprise the steps of: setting the distance of the groove-like pattern in the interconnecting layer to the size that can be filled with the upper interconnecting layer; and setting the hole pattern formed in the fifth step to have the size that can be filled with the upper interconnecting layer, the effect of securing contrast with the transfer mark may be obtained even when the pattern is completely embedded, in addition to the effect of the above-described inventions.

As described above, since the method for producing a transfer mark for the multi-layer interconnecting process may further comprise, when the hole pattern formed in the fifth step is narrow, and the transfer mark is read from surface reflection in the state wherein the transfer mark has been filled with the upper interconnecting layer, a step for setting the hole pattern formed in the fifth step to have the size that may be filled by the upper interconnecting layer, the effect of securing contrast with the transfer mark may be obtained even when the pattern is completely embedded, in addition to the effect of the above-described inventions.

According to a fourth aspect of the present invention, there is provided a method for producing a transfer mark for a multi-layer interconnecting process for avoiding an effect of dishing on formation of a groove-like pattern for a multi-layer interconnecting, and for increasing and stabilizing reading accuracy of a transfer mark used for transfer in the following step so as to align with a transfer location in the preceding step, comprising the steps of: forming a pattern having grooves in two directions intersecting perpendicularly to each other as a transfer mark for photoengraving; and forming a pattern having grooves in two directions intersecting perpendicularly to a pattern having the grooves of the transfer mark for photoengraving as an direction of the grooves of an interconnecting layer, the following effect may be obtained. The first effect may be that the effect of dishing may be avoided when a groove-like pattern for multi-layer interconnection is formed. The second effect may be that the reading accuracy of a transfer mark used for transfer in the following step so as to align with the transfer location in the preceding step may be increased and stabilized.

As described above, since the method for producing a transfer mark for the multi-layer interconnecting process may further comprise a step for forming a shape where equidistant grooves are repeated as the groove-like pattern, the effect of securing contrast with the transfer mark may be obtained even when the pattern is completely embedded, in addition to the effect of the above-described inventions.

As described above, since the method for producing a transfer mark for the multi-layer interconnecting process may further comprise a step for forming a parallel groove-like pattern as the transfer mark for photoengraving, and a step for forming parallel grooves intersecting perpendicularly to the groove-like pattern of the interconnecting layer as the groove-like pattern of the interconnecting layer under the transfer mark for photoengraving, the effect of securing contrast with the transfer mark may be obtained even when the pattern is completely embedded, in addition to the effect of the above-described inventions.

As described above, since the method for producing the transfer mark e for the multi-layer interconnecting process may further comprise the step of limiting the width of the groove-like pattern of the interconnecting layer to a width completely filled by a step of filling the gaps between the interconnecting layers, the effect that the cross-sectional after forming the overlying interconnecting layer may be altered by the width of the groove-like pattern of the transfer mark may be obtained, in addition to the effect of the above-described inventions.

As described above, since the method for producing the transfer mark for the multi-layer interconnecting process may further comprise: a first step of forming a pattern having equidistant grooves in two directions intersecting perpendicularly to each other on the surface of an insulation film on a substrate using photoengraving and dry etching; a second step of forming the interconnecting layer comprising at least a layer of conductor on the pattern having equidistant grooves in two directions intersecting perpendicularly to each other; a third step of performing CMP treatment so that the interconnecting layer is left only inside the groove-like pattern in two directions intersecting perpendicularly to each other; a fourth step of forming an interlayer insulation film on the insulation film and the interconnecting layer after the CMP treatment is performed so that the interconnecting layer is left only inside the groove-like pattern in two directions intersecting perpendicularly to each other; a fifth step of forming a hole pattern using photoengraving and dry etching; a sixth step of forming a conductor film for filling the hole pattern; a seventh step of entirely dry etching the inside of the hole pattern; and an eighth step of photoengraving by depositing an upper interconnecting layer on the conductor film and the interconnecting layer inside the hole pattern, the effect of preventing the occurrence of dishing on the polished surface of the insulating film and the interconnecting layer may be obtained by carrying out the first to third steps, even when the interconnecting layer is subjected to CMP, because the upper surface of the groove-like pattern comprising the insulating film on the substrate, resulting in the formation of a flat surface, in addition to the effect of the above-described inventions. Furthermore, by carrying out the fourth and fifth steps, a precision hole pattern may be formed because photoengraving is performed on the surface of the flat interlayer insulating film. Furthermore, by carrying out the sixth to eighth steps, if the gap of the groove-like pattern of the interconnecting layer is completely filled after carrying out the sixth step (hole pattern embedding step), the bottom of the hole pattern becomes substantially flat, resulting in the high accuracy of reading the transfer mark. Namely, by designing the gap of the groove-like pattern of the interconnecting layer so that the gap of the groove-like pattern of the interconnecting layer is completely filled in the sixth step (hole pattern embedding step), the reading of the transfer mark may be facilitated.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The, entire disclosure of Japanese Patent Application No. 11-191875 filed on Jul. 6, 1999 including specification, claims, drawings and summary are incorporated herein by reference in its entirety.

What is claimed is:

1. A transfer mark structure for forming a multi-interconnecting layer in a silicon substrate comprising a plurality of first grooves formed in an insulating film formed on said silicon substrate, said plurality of first grooves formed being equidistant and parallel to each other;

an interlayer insulating film having an opening that exposes said plurality of first grooves; and a second groove covered by a conductive film so as to embed said plurality of first grooves, wherein said first grooves are thin and long depression, and said second groove is formed perpendicular to the line direction of said first grooves.

2. The transfer mark structure according to claim 1, wherein the first grooves are completely filled with the conductive film material.

* * * * *